United States Patent

Bloom et al.

[11] 4,049,459
[45] Sept. 20, 1977

[54] ORGANIC VOLUME PHASE HOLOGRAPHIC RECORDING MEDIUM

[75] Inventors: Allen Bloom, East Windsor; Robert Alfred Bartolini, Trenton, both of N.J.

[73] Assignee: RCA Corporation, New York, N.Y.

[21] Appl. No.: 661,521

[22] Filed: Feb. 26, 1976

[51] Int. Cl.² ............................ G03C 1/68; G03C 1/76
[52] U.S. Cl. .................. 96/115 R; 96/27 H; 96/67; 350/3.5
[58] Field of Search ............ 96/27 H, 35.1, 67, 115 R, 96/115 P; 350/3.5; 204/159.16

[56] References Cited

U.S. PATENT DOCUMENTS

| | | | |
|---|---|---|---|
| 3,547,509 | 12/1970 | Brandes | 350/3.5 |
| 3,580,657 | 5/1971 | Sheridon | 350/3.5 |
| 3,658,526 | 4/1972 | Haugh | 96/27 H |
| 3,667,946 | 6/1972 | Sturdevant | 96/27 H |
| 3,707,371 | 12/1972 | Files | 96/27 H |
| 3,764,333 | 10/1973 | LeClair et al. | 96/67 |
| 3,809,686 | 5/1974 | Chandross et al. | 96/27 H |
| 3,926,637 | 12/1975 | Bartolini et al. | 96/115 R |
| 3,951,663 | 4/1976 | Ross | 96/67 |

*Primary Examiner*—Edward C. Kimlin
*Attorney, Agent, or Firm*—H. Christoffersen; Birgit E. Morris; Joseph T. Harcarik

[57] ABSTRACT

Holographic recording media which form permanent holograms with excellent recording sensitivity are prepared from α-diketones which are capable of intermolecular hydrogen atom abstraction dissolved in a transparent, cured vinyl benzene polyester polymer/host.

5 Claims, 1 Drawing Figure

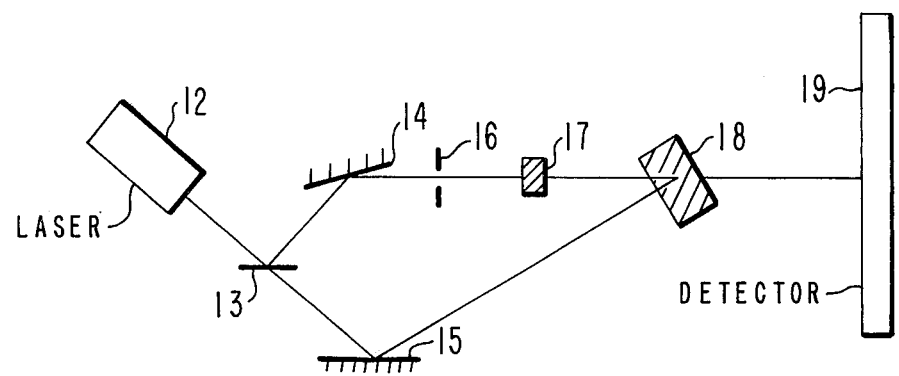

ORGANIC VOLUME PHASE HOLOGRAPHIC RECORDING MEDIUM

This invention relates to a recording medium for volume phase holography. More particularly, this invention relates to a holographic recording medium with excellent recording sensitivity for permanent volume phase holograms comprising certain α-diketones which are capable of intermolecular hydrogen atom abstraction dissolved in a transparent, cured vinyl benzene polyester polymer host.

CROSS-REFERENCES TO RELATED APPLICATIONS

This application discloses subject matter which is related to that disclosed in the copending application of R. A. Barolini, W. J. Burke, and Allen Bloom, entitled, "Method for Desensitizing Recorded Organic Volume Phase Holographic Recording Media," Ser. No. 566,706, filed Apr. 10, 1975, now U.S. Pat. No. 4,022,618; in the copending application of A. Bloom, R. A. Bartolini, and H. A. Weakliem, entitled, "A Method of Improving the Sensitivity of Organic Phase Holographic Recording Media," Ser. No. 566,705, filed Apr. 10, 1975; and in the copending application of A. Bloom, D. L. Ross, R. A. Bartolini, and L. K. Hung, entitled, "Organic Volume Phase Holographic Recording Media," Ser. No. 498,771, filed Aug. 19, 1974 now abandoned.

BACKGROUND OF THE INVENTION

The U.S. Pat. No. 3,951,663 of D. L. Ross incorporated by reference herein describes holographic recording media including certain α-diketones dissolved in a cured polymeric host. The polymeric host is selected from the group consisting of acrylic polyesters and epoxy resins.

The U.S. Pat. No. 3,926,637 of R. A. Bartolini and A. Bloom incorporated by reference herein describes holographic recording medium which form permanent holograms from α-diketones which are capable of intermolecular hydrogen atom extraction dissolved in a transparent cured acrylic polyester host.

The copending application of A. Bloom, R. A. Bartolini, and H. A. Weakliem described above and incorporated by reference herein describes the sensitivity of organic phase holographic recording media comprising an α-diketone and acrylic polyester polymer which can be improved by heating the recording medium either during or after recording.

The copending application of R. A. Bartolini, William J. Burke, and A. Bloom described above and incorporated by reference herein describes organic volume phase holographic recording medium comprising an α-diketone and an acrylic polyester polymer which is desensitized by exposing the medium to light after recording is complete.

SUMMARY OF THE INVENTION

We have discovered that a polymeric host comprising cured, light-insensitive vinyl benzene polyester polymers containing dissolved therein certain α-diketones which are capable of intermolecular hydrogen atom extraction, form excellent permanent volume phase holographic recording media with excellent recording sensitivity.

BRIEF DESCRIPTION OF THE DRAWING

The FIGURE is a schematic diagram of an apparatus suitable for recording volume phase holograms.

DETAILED DESCRIPTION OF THE INVENTION

The vinyl benzene polyester polymer host material of the instant invention is a reaction product of reactants consisting essentially of unsaturated polyester and vinyl benzene which vinyl benzene is represented by the following formula:

wherein $R''$ is vinyl or alkyl substituted vinyl, $R'''$ is a $C_{1-5}$ alkyl group, $n$ is an integer of 1, 2, or 3, and $m$ is an integer of 0, 1, or 2. Such monomers include styrene, p-divinyl benzene, α-methyl styrene, 1-methyl-4-vinyl benzene and the like with styrene being a preferred reactant.

Suitable unsaturated polyesters are those derived from ethylenically unsaturated polycarboxylic acids and polyhydric alcohols such as fumaric acid, maleic acid, propylene glycol, ethylene glycol, ethylene glycol derivatives and the like.

Commercially available vinyl benzene polyester host precursors are Koppers 1082-3 available from the Koppers Co., Paraplex P-43, available from the Rohm and Haas Co., and Polycast, available from the Resins Research Corp. All these precursors contain styrene as the vinyl benzene reactant. The polyester reactants of Koppers 1082-3 and Paraplex P-43 are derived from phthalic acid, maleic acid and propylene glycol. The Polycast precursor additionally incorporates an ethylene glycol unit into the polyester reactant.

The polymeric host must be capable both in its uncured and cured states of dissolving certain α-diketones which will be described in more detail below. Additionally, the polymeric host must be transparent when cured. The polymeric host should also be able to be polymerized rapidly to give strain-free polymers at relatively low temperatures utilizing initiators, when required, which are inert with respect to the α-diketone employed.

The α-diketones capable of intermolecular hydrogen atom abstraction are characterized by the formula:

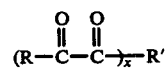

wherein R and R' independently can be methyl, a branched chain alkyl group or a cyclic hydrocarbon group wherein the carbon atoms are part of an aromatic or aliphatic ring or R and R' together can form part of an aromatic or aliphatic ring; and $x$ is either 1 or 2. Illustrative of suitable α-diketones are benzil, 1,3-or 1,4-bis-(phenylglyoxalyl)benzene, camphorquinone, 2,3-butanedione, 1-phenyl-1,2-propanedione and the like.

The choice of α-diketone, host polymer, and concentration of α-diketone in the host polymer depends upon several factors: the wavelength of light the medium is designed for; the solubility of the α-diketone in the uncured host material; the molecular weight of the α-diketone; the absorption spectrum of the α-diketone in the wavelength region used during recording and readout; and the thickness of the recording medium. The α-diketone will be chosen so that its absorption band wavelength tail is close to the recording wavelength, or, that it will have low optical density at that wavelength, e.g., less than about 0.2. This allows high concentrations of the α-diketone to be employed with little or no loss in efficiency. Amounts of about 1 to about 25%, preferably about 2.5 to about 10%, by weight of the α-diketone in the host polymer can be used.

The recording media as hereinabove described are thus prepared simply by dissolving the α-diketone in the uncured vinyl benzene polyester precursor and curing the solution to form clear solid castings of the shape and thicknesses desired. Alternatively, thick castings can be cut and polished after casting to obtain the desired shape and thickness.

The FIGURE is a schematic diagram of a system useful for recording and readout of holographic information in the recording medium described above. Referring now to the FIGURE, the system includes a laser 12 which emits a coherent light beam. The light beam passes through a beam splitter 13. A portion of the beam is reflected from the beam splitter 13 onto a first mirror 14; the remainder of the light beam passes through onto a second mirror 15. The mirrors 14 and 15 are adjusted so that the plane polarized beams reflected from them meet at a predetermined angle, such as 30° to 45°. The portion of the beam reflected from the beam splitter 13 is the object beam. the object beam passes through a shutter 16 and then through the object to be recorded 17. The portion of the beam which passes through the beam splitter 13 is the reference beam. The recording medium 18 is positioned at the intersection of the reference and object beams. During readout, the shutter 16 is closed and only the reference beam passes through to the recording medium. The image can be viewed on a detector screen 19.

When more than one image is to be recorded in the recording medium, means for rotating or otherwise changing the selected portion of the recording medium exposed to the light beams is provided. During readout, means to rotate the recording medium or means to change the position or angle of the reference beam at the required angle of incidence will also be provided.

While it has been found that the holographic storage media of the instant invention have excellent recording sensitivity at room temperature, the recording sensitivity of the holographic storage media can be increased by heating the recording media during or after recording. The procedure is similar to that discussed more fully in the copending application of Bloom, Bartolini, and Weakliem mentioned above.

After recording has been completed the holographic storage media can be desensitized by flooding the media with light which is either coherent light or incoherent light. The method is similar to the method discussed in greater length in the copending application of Bartolini, Burke, and Bloom mentioned previously.

The invention will be further illustrated by the following examples, but it is to be understood that the invention is not meant to be limited to the details described therein.

EXAMPLE I

One-half gram of camphorquinone was admixed with 10 grams of Koppers 1082-3 precursor which was analyzed to have the composition as recorded in Table I. Three drops of methyl ethyl ketone peroxide hardener were added and the mixture was stirred and placed in a vacuum dessicator for several minutes to remove any gas bubbles. The solution was poured into several one centimeter (hereinafter cm) thick molds and allowed to cure at room temperature for 3 days.

After removal from the molds, the castings were clear and hard and of a light yellow color.

A sample one centimeter cube was cut and polished. Holograms were recorded in an apparatus according to the FIGURE using a laser with a wavelength of 5,145 Angstroms. Laser power of 15 Joules/cm$^2$ produced a 50% efficient hologram that was self-fixing and permanent.

EXAMPLE II

Example I was substantially repeated except that 0.25 gm of camphorquinone was admixed with 5 gms of Rohm and Haas Paraplex P-43 instead of Koppers 1082-3 and 1 drop of cobalt naphthenate and 2 drops of methyl ethyl ketone peroxide were used as promoter and hardener respectively. The analyzed composition of Paraplex P-43 is recorded in Table I. A 65 Joules/cm$^2$ exposure with a laser having a wavelength of 5,145 Angstroms produced a 42% efficient hologram which was self-fixing permanent.

EXAMPLE III

Example II was repeated except that Resin Research Corporation's Polycast was substituted as the host medium and 3 drops of Polycast hardener was employed. The analyzed composition of Polycast is recorded in Table I. A 170 Joules/cm$^2$ exposure with a laser having a wavelength of 5,145 Angstroms produced a 54% efficient self-fixing and permanent hologram.

EXAMPLE IV

This Example is presented to shown the increased recording sensitivity when the holographic recording media is postheated.

A sample was prepared as described in Example I. Three holograms were recorded at room temperature in an apparatus according to the FIGURE using a laser with a wavelength of 5,145 Angstroms, rotating the sample 1° between recordings. The sample was then heated to 40° C. Table II summarizes the results of the laser power employed and the holographic efficiency due to the post-heating.

TABLE II

| Exposure (Joules/cm$^2$) | Holographic Efficiency of Post-Heating (%) |
| --- | --- |
| 1.3 | 10 |
| 2.7 | 54 |
| 6.8 | 66 |

TABLE I

| | Molar Ratios | | | | Styrene wt. % |
|---|---|---|---|---|---|
| | Maleic Acid | Phthalic Acid | Propylene Glycol | Ethylene Glycol Unit | |
| Koppers 1083-3 | 0.24 | 0.68 | 1 | — | 44 |
| Paraplex P-43 | 0.44 | 0.53 | 1 | — | 34 |
| Polycast | 0.18 | 0.72 | 0.58 | 0.42 | 39 |

What is claimed is:

1. In a medium for recording permanent volume phase holograms consisting essentially of a cured transparent polymer containing a soluble α-diketone being capable of intermolecular hydrogen atom abstraction and which has the formula

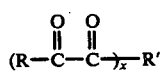

wherein R and R' independently are selected from the group consisting of methyl, branched-chain alkyl and cyclic hydrocarbon groups wherein the carbon atoms are part of an aromatic or aliphatic ring and R and R' together can form part of an aromatic or aliphatic ring; and $x$ is an integer of 1 or 2; and said α-diketone being present in an amount sufficient to cause a change in the index of refraction when illuminated by a spatially modulated coherent light beam having a wavelength corresponding to the absorption band wavelength tail of said α-diketone, the improvement which comprises:

utilizing as said cured transparent polymer a vinyl benzene polyester polymer wherein said polymer is a reaction product of an unsaturated polyester and a vinyl benzene which has the formula

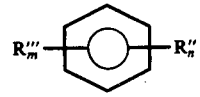

wherein R'' is a vinyl or an alkyl substituted vinyl group, R''' is a $C_{1-5}$ alkyl group, $n$ is an integer of 1–3, and $m$ is an integer of 0–2; whereby sensitivity is increased.

2. A holographic recording medium according to claim 1, wherein the α-diketone is camphorquinone.

3. A holographic recording medium according to claim 1, wherein from about one to twenty-five percent by weight of the α-diketone is present based on the weight of said vinyl benzene polyester polymer.

4. A holographic recording medium according to claim 1, wherein from about 2.5 to about 10% by weight of the α-diketone is present based upon the weight of said vinyl benzene polyester polymer.

5. A recording medium according to claim 1, wherein the vinyl benzene is styrene.

* * * * *